United States Patent
Fröb et al.

(10) Patent No.: US 7,101,626 B1
(45) Date of Patent: Sep. 5, 2006

(54) PHOTO-LUMINESCENCE LAYER IN THE OPTICAL SPECTRAL REGION AND IN ADJACENT SPECTRAL REGIONS

(75) Inventors: Hartmut Fröb, Reinhardtsgrimma (DE); Karl Leo, Dresden (DE); Matthias Kurpiers, Dresden (DE)

(73) Assignee: Osram GmbH, (DE)

( * ) Notice: Subject to any disclaimer, the term of this patent is extended or adjusted under 35 U.S.C. 154(b) by 0 days.

(21) Appl. No.: 10/204,585

(22) PCT Filed: Feb. 23, 2000

(86) PCT No.: PCT/DE00/00498

§ 371 (c)(1),
(2), (4) Date: Nov. 26, 2002

(87) PCT Pub. No.: WO01/62868

PCT Pub. Date: Aug. 30, 2001

(51) Int. Cl.
*C09K 11/00* (2006.01)
*B32B 9/00* (2006.01)

(52) U.S. Cl. ............... 428/446; 428/690; 428/702; 252/301.16

(58) Field of Classification Search ........... 428/690, 428/702, 323, 446; 252/301.16, 301.17
See application file for complete search history.

(56) References Cited

U.S. PATENT DOCUMENTS 5,783,292 A * 7/1998 Tokito et al. ............... 428/212

FOREIGN PATENT DOCUMENTS

| DE | 3804293 | 8/1989 |
| DE | 19625622 | 1/1998 |
| DE | 19638667 | 4/1998 |
| DE | 19836943 | 4/2000 |

OTHER PUBLICATIONS

Zhang et al., "Jet Vapor Deposition of Organic Guest-Inorganic Host Thin Films for Optical and Electronic Applications", Journal of Electronic Materials, vol. 23, No. 11 (1994), pp. 1239-1244.*
Froeb H. et al., "Extremely high quantum efficiencies from organic dyes in inorganic matrix layers", *Conference on Lasers and Electro-optics, CLEO*, OSA Technical Digest Series, vol. 6., San Francisco, CA, May 1998, abstract.
P. Schlotter et al., LUCOLED, Applied Phys. A 64, 417 (1997).
M.A. Herman et al., Sources of Atomic and Molecular Beams, Molecular Beam Epitaxy, Springer 1989, pp. 29-59.
Fröb H. et al., "Extremely high quantum efficiencies from organic dyes in inorganic matrix layers", *Conference on Lasers and Electro-optics, CLEO*, OSA Technical Digest Series, vol. 6., pp. 210-211, San Francisco, CA, May 1998.

* cited by examiner

*Primary Examiner*—Marie Yamnitzky
(74) *Attorney, Agent, or Firm*—Fish & Richardson P.C.

(57) ABSTRACT

This invention relates to a photoluminescent layer in the optical and adjoining spectral regions based on a solid solution of organic dyes. The photoluminescent layer consists of organic dye molecules with a low dye concentration and a matrix material of metal oxides, with the matrix material having a slightly sub-stoichiometric oxygen content. A method and a device for producing the photoluminescent layer are described.

25 Claims, 4 Drawing Sheets

Figure 1:
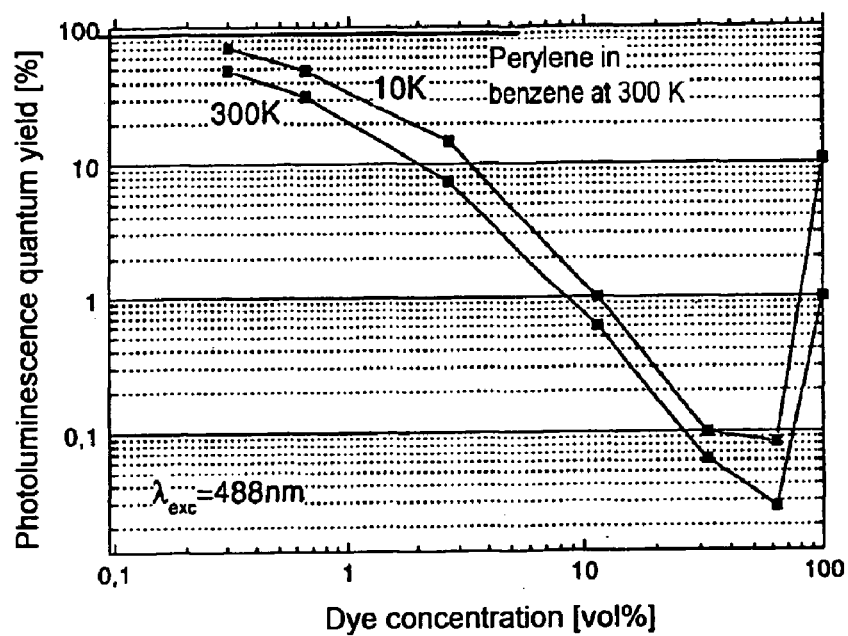

| | |
|---|---|
| Quartz cuvette | 1 |
| Graphite block | 2 |
| Tungsten heater (insulated) | 3 |
| Radiation shield (tantalum) | 4 |
| Copper jacket (water-cooled) | 5 |
| Dye | 6 |
| Thermocouple | 7 |

PHOTO-LUMINESCENCE LAYER IN THE OPTICAL SPECTRAL REGION AND IN ADJACENT SPECTRAL REGIONS

FIELD OF THE INVENTION

This invention relates to a photoluminescent composition (e.g., a layer) as well as related articles, methods, and devices.

BACKGROUND

A more or less effective luminescence conversion has already been used for some time in various fields, for example in radiation detector technology. In general, functional units that are used for luminescence conversion are based on absorption/emission processes. Utilized is the fact that there is a shift of luminescence to longer wavelengths compared to absorption in most cases, for energetic reasons. This phenomenon can be used, for example, for spectral matching of detector sensitivity to a radiation source. Furthermore, the property of luminescence radiation no longer to be bound to the direction of the incident radiation is of interest, since concentration of radiation in a medium can be realized by total reflection at the interfaces.

A recent example is the production of "white" light by way of partial conversion of the radiation from a blue luminescent diode. The LUCOLED (P. Schlotter, R. Schmidt, J. Schneider, Appl. Phys. A 64, 417 (1997)) utilizes this principle. A portion of the high-energy blue luminescent radiation is absorbed by a suitable layer in the beam direction and is emitted again shifted toward lower energies, so that a white color impression is produced by additive mixing.

DE 196 25 622 A1 describes such a light-radiating semiconductor component with a semiconductor body emitting radiation and with a luminescence conversion element. The semiconductor body has a sequence of semiconductor layers that emits electromagnetic radiation with a wavelength $\lambda$ of $\leq 520$ nm, and the semiconductor conversion element converts radiation of a first spectral subregion of the radiation emitted by the semiconductor body from radiation originating from a first wavelength region into radiation of a second wavelength region, so that the semiconductor component emits radiation from a second spectral subregion of the first wavelength region and radiation of the second wavelength region. Thus, for example, radiation emitted by the semiconductor body is absorbed with spectral selectivity by the luminescence conversion element and is emitted in the longer-wavelength region (in the second wavelength region). In this method, organic dye molecules are imbedded in an organic matrix.

DE 196 38 667 A1 also discloses a semiconductor component with a semiconductor body emitting radiation and a luminescence conversion element that emits mixed-color light, with the luminescence conversion element having a luminous inorganic substance, in particular a phosphor.

Besides spectral suitability with regard to the corresponding application, such a layer has two principal requirements: The photoluminescence quantum yield must be high, usually clearly greater than 50%, and its stability must permit long service lives, usually more than 10,000 hours.

The basic concept for realizing such a layer with organic dyes consists of separating and immobilizing molecules in a matrix so that they behave like monomers with optical properties similar to a liquid solution, particularly with high quantum yield. Polymers and sol-gel layers are known as matrices.

Mixed layers that were produced from the organic dyes 3,4,9,10-perylenetetracarboxylic acid dianhydride (PTCDA) and $SiO_2$ by co-vaporization onto quartz substrates under high vacuum are described in H. Fröb, K. Kurpiers, K. Leo, CLEO'98, San Francisco/CA, May 1998, 210; 1998 OSA Technical Digest Series Vol. 6, published by Optical Society of America ("*The Fröb publication*"). The concentration range studied was 0.65–100 vol. %. It was observed that the absorption and emission spectra for decreasing concentrations gradually approach those in a liquid solution, and for the lowest concentration a photoluminescence quantum yield of about 50% is achieved at room temperature (FIG. 6, corresponding to FIG. 2 of the Fröb publication).

A device used for this purpose is described by M. A. Herman, H. Sitter, Molecular Beam Epitaxy, Ch. 2 (Sources of Atomic and Molecular Beams), Springer 1989, pp. 29–59. A dye vaporizer and a metal oxide vaporizer are provided in a vacuum chamber, whose vapor beam is aimed at a substrate, with the dye vaporizer being cup-shaped and consisting, viewed from the inside toward the outside, of a quartz cuvette, a graphite block, a heater, a shield, and a jacket, with a thermocouple being placed between the quartz cuvette and the graphite block in the bottom center of the cup.

Figure 7:
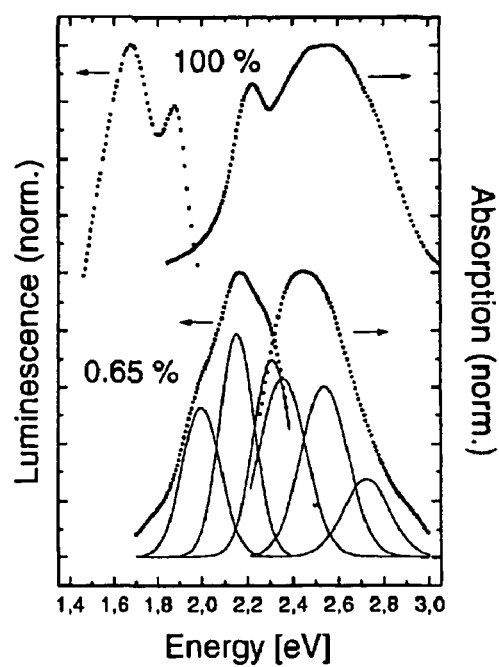

FIG. 7 shows the normalized absorption and emission of 30-nm thick layers for a pure and a diluted dye layer. It is important that the spectra of the diluted layers can be fitted to those of monomers with their typical vibrational progression. It is found that the line width remains constant for all low concentrations; its enlargement compared to that observed in liquid solution is not surprising, considering the inhomogeneous conditions of the surroundings of the molecule.

The authors hold a weakening Förster transfer because of the increasing mean molecular separation responsible for the increase of quantum yields toward lower concentrations, and they expect a maximum at about 0.1 vol. %, but of course without experimental confirmation of this. No predictions are made about the lifetime, with regard to which all organic conversion layers so far have foundered.

SUMMARY OF THE INVENTION

The invention relates to a photoluminescent composition (e.g., a layer) as well as related articles, methods, and devices.

It is important for the solution of the problem that organic dye molecules are imbedded in an inorganic, amorphous or nanocrystalline matrix. The use of a silicon or metal suboxide in the vaporization is especially crucial for the optical stability of the photoluminescent layer. During the deposition of the silicon or metal suboxide in mixed vaporization of the components under high vacuum on the substrate, the suboxide reacts with residual gaseous oxygen of the high vacuum, with a slightly sub-stoichiometric oxygen content being reached by the matrix material under suitable vapor deposition conditions (characterized by the ratio of oxygen partial pressure to rate of vapor deposition). It is characteristic of the sub-stoichiometric oxygen content that with a matrix material of $SiO_x$ or $TiO_x$, x is between 1.95 and 2. A precise adjustment of the dye vapor deposition rate is necessary. For a low dye concentration, a definite adjustment to a low dye deposition rate (down to $<10^{-5}$ nm/s) is critically important. In certain embodiments, a temperature-regulated dye vaporizer is used for this purpose.

The vaporizer pursuant to the invention differs from the dye vaporizers known from the state of the art in the fact that the cover in the cup-shaped opening of the dye vaporizer constricted to a cut-out hole is connected to the quartz cuvette and is displaced toward the dye, so that the cut-out hole in the cover has a temperature like that of the heated quartz cuvette.

In some embodiments, the configuration of the photoluminescent layer makes it possible by extremely low dye surface densities, for example, to provide luminescence standards with almost ideal point sources of light for appropriately equipped microscopes (for example optical near-field microscopes, confocal luminescence microscopes) for the determination of resolving power and optical transmission functions or tests for the determination of the optical properties of individual molecules.

The benefits produced by the invention in particular, lie in the fact that a material is available that satisfies practical requirements with regard to optical stability with an average number of excitation/de-excitation cycles per molecule greater than $10^{11}$, that can be applied to very diverse substrates by dry technology (mixed vaporization of the components under high vacuum), and that at the same time has the highest known concentration of dyes in solutions without having photoluminescence quantum yields limited by aggregation or by Förster transfer.

Embodiments advantageously provide high optical stability for a photoluminescent layer based on a solid solution of organic dyes, as measured by the numerical midpoint of the excitation/de-excitation cycles per molecule before a fixed value of the decline of photoluminescence of the overall system.

Figure 2:
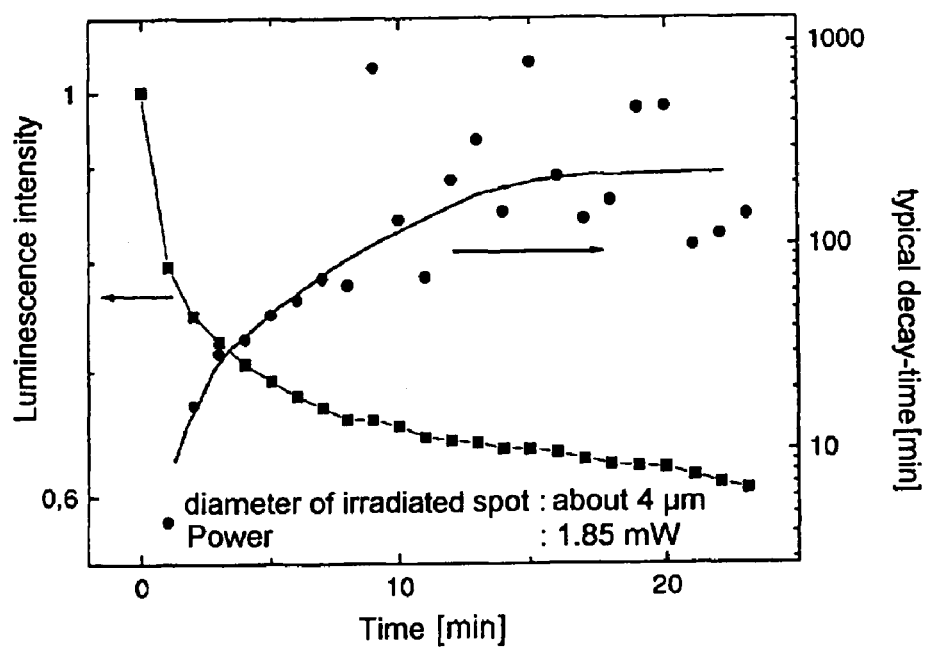
Figure 3:
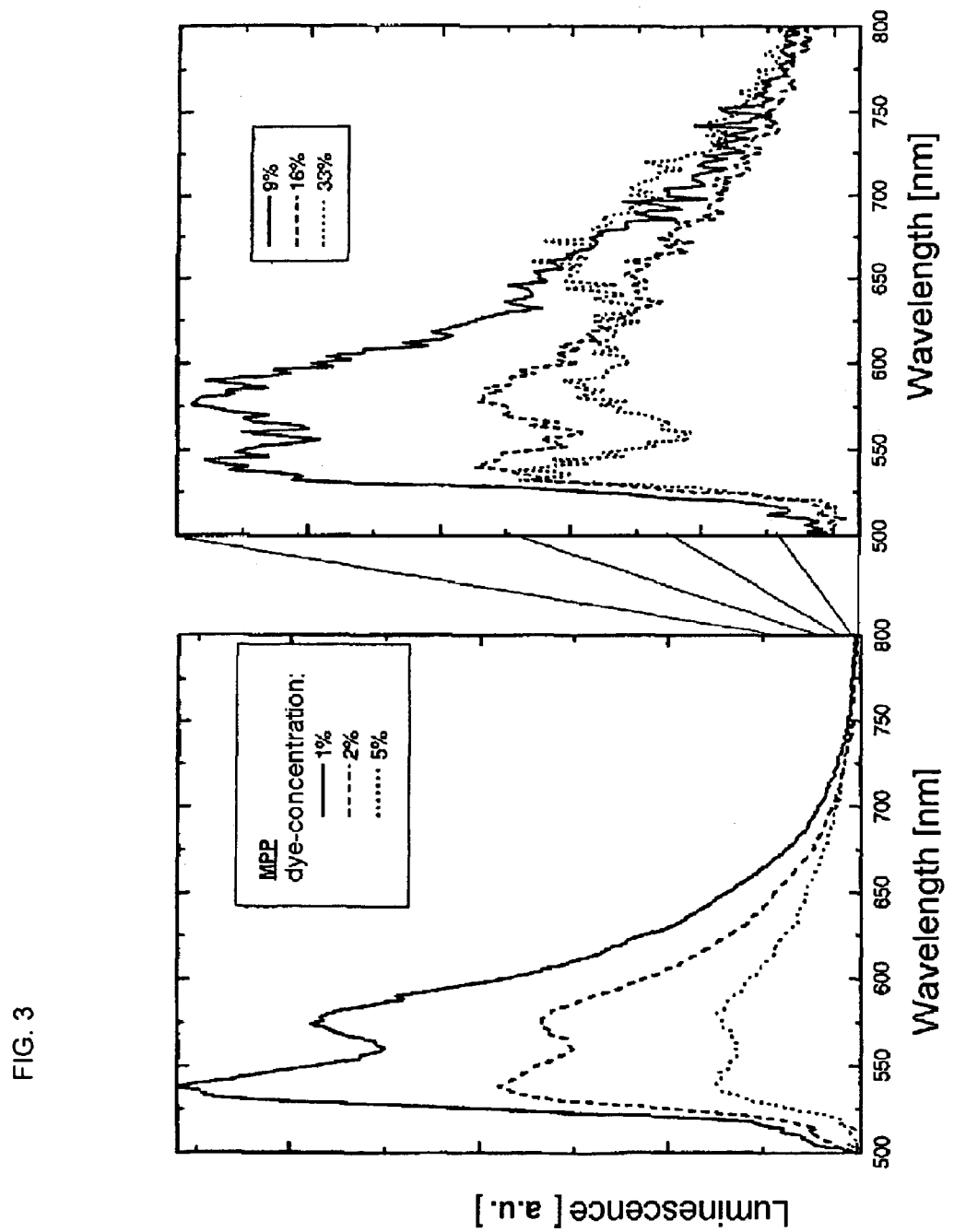

The invention is explained in detail below with reference to examples of embodiment. The drawings show:

FIG. 1 an illustration of the photoluminescence quantum yield of 30-nm thick layers with various dye concentrations FIG. 2 an illustration of the change of photoluminescence with high-intensity irradiation FIG. 3 an illustration of the luminescence of $SiO_x$ layers with equal amounts of the dye MPP with different dye concentration.

Figure 4:
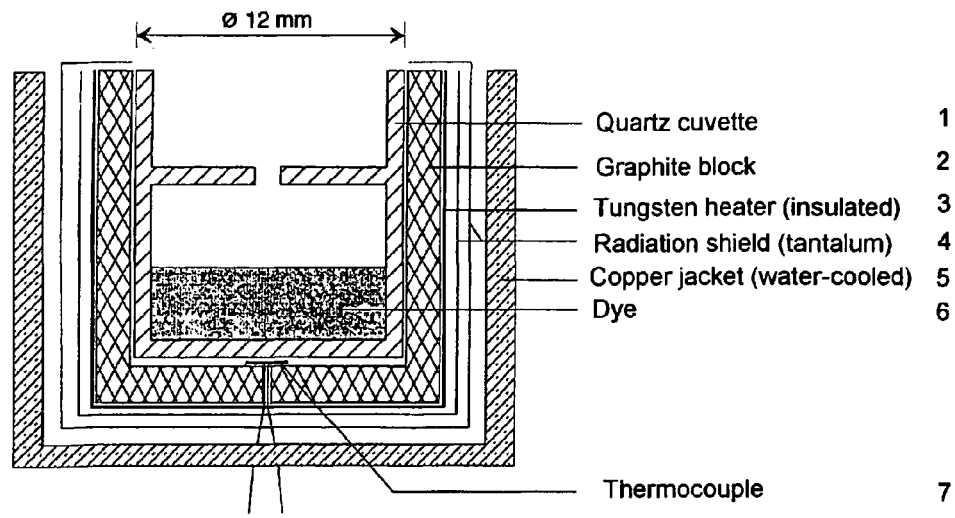

FIG. 4 a dye vaporizer pursuant to the invention in cross section

Figure 5:
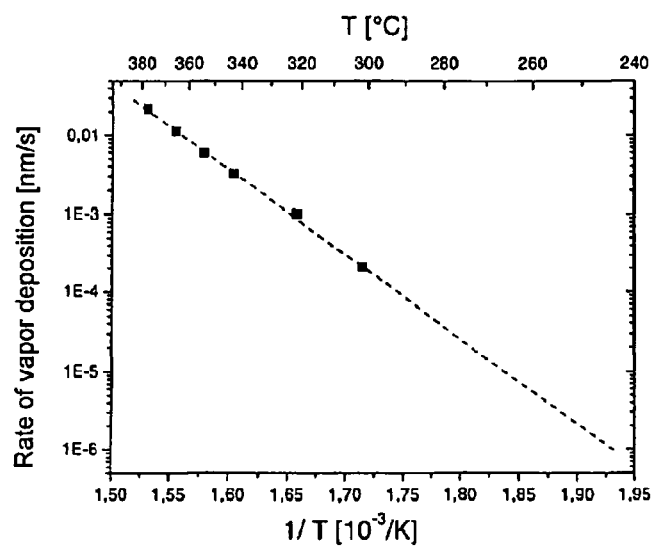

FIG. 5 an Arrhenius plot for calibrating the dye vaporizer

Figure 6:
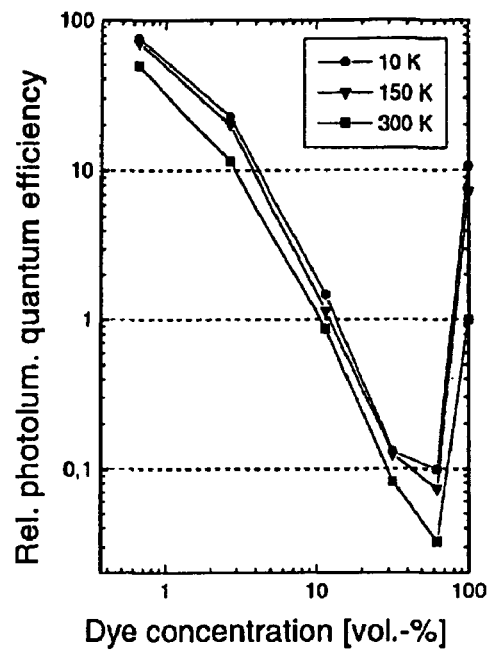

FIG. 6 an illustration of the photoluminescence quantum yield of PTCDA-$SiO_2$ mixed layers at room temperature FIG. 7 normalized absorption and emission of 30-nm thick layers for pure and diluted PTCDA layers

DETAILED DESCRIPTION

A photoluminescent layer is described. The layer is photoluminescent in the optical and adjoining spectral regions. The layer is typically a solid solution of organic dye molecules within a silicon oxide or metal oxide. The layer can be applied (e.g., vapor deposited) on a substrate.

Applications of the layer include using the layer to provide white light, using the layer to input or output light to or from a waveguide, using the layer as a radiation detector, or using the layer as a point source for testing near-field microscopes or the like. In general, the layer is applied on a substrate for particular applications.

EXAMPLE 1

In Example 1,3,4,9,10-perylenetetracarboxylic acid dianhydride (PTCDA) was incorporated in an $SiO_x$ matrix, where $1.95<x<2$. The layer is produced by thermal vaporization at operating pressures of about $10^{-4}$ Pa produced by a turbomolecular pump, with SiO having been vapor-deposited at a deposition rate of $10^{-2}$ nm/s for the production of the matrix, which reacts on the substrate with residual gaseous oxygen to give $SiO_x$. The quartz resonators used in this multiple-source vapor deposition for the independent control of deposition rate and layer thickness are shielded from the other sources. To be able to measure even very small deposition rates, the measuring head for PTCDA is at a small distance from the vaporizer; this is possible with no problems because of the comparatively low vaporization temperature (typically 300–400° C.). For extremely small rates of vapor deposition, a temperature-regulated dye vaporizer was developed that permits stable rates down to $<10^{-5}$ nm/s for a period of at least one hour.

Radiationless energy transmission to nonradiating traps is the limiting factor for luminescence quantum yield. To reach a quantum yield similar to that in liquid solution, volume concentrations of about 0.1% are necessary in the present system (FIG. 1). Compared to the data given in H. Fröb, M. Kurpiers, K. Leo, CLEO '98, San Francisco/CA, May 1998, 210, 1998 OSA Technical Digest Series Vol. 6, published by Optical Society of America, both a lower concentration was achieved and the quantum yields were determined and corrected with greater accuracy.

Results of studies of the optical stability of the layer are shown in FIG. 2. To achieve adequately high excitation densities, a confocal microscope was used (excitation wavelength 532 nm); the luminescence was detected. After an initially severe non-exponential decline, a state is reached that can be described by a lifetime with about $10^{11}$ excitation cycles per molecule, a value that is about 2 orders of magnitude above the best known in such systems.

One possible application is found as a photoluminescent layer in a system similar to the LUCOLED (P. Schlotter, R. Schmidt, J. Schneider, Appl. Phys. A 64, 417 (1997)). Applied to luminous densities occurring in luminescent diodes, service lives of the order of magnitude of $10^5$ hours would be expected, based on the data in FIG. 2.

EXAMPLE 2

Production is analogous to that in Example 1, using N,N-dimethylperylene-3,4,9,10-bisdicarboximide (MPP), and the same effects are observed relative to the context of the invention: Increase of the photoluminescence quantum yield with decreasing concentration (FIG. 3) and optical stability in the aforementioned sense of about $10^{11}$ excitation cycles per molecule. The fact that the quantum yield becomes maximum at comparatively higher concentrations is due to the smaller absorption strength of MPP compared to that of PTCDA.

EXAMPLE 3

Production is analogous to that in Example 1, with the difference that (a) the vapor deposition rate of PTCDA is extremely low, typically $<10^{-5}$ nm/s, and (b) the PTCDA vapor jet to the substrate is released by suitable diaphragms for only a very short time. Assuming that the procedure is performed extremely cleanly and exactly, dye molecules in this way can be placed enclosed by matrix material, with an average lateral molecular spacing of more than 100 nm being achievable. An optical near-field microscope at this time can achieve a resolving power of better than 50 nm; with a cover layer of 5 nm $SiO_x$ over the dye layer there is thus a test that permits determining the point transmission function by a direct path, or with which optical properties of individual molecules can be determined.

FIG. 4 shows a dye vaporizer that is placed in a vacuum chamber with a metal oxide vaporizer to carry out the procedure. The vapor jet of each vaporizer is aimed at a substrate. Diaphragms can be placed between vaporizers and substrate to interrupt the vapor deposition. The dye vaporizer shown in FIG. 4, viewed from the inside to the outside, consists of a quartz cuvette 1, a graphite block 2, a heater 3, a shield 4, and a water-cooled copper jacket 5. There is a thermocouple 7 in the bottom center of the cup between the quartz cuvette 1 and the graphite block 2. There is a cover constricted to a cut-out hole in the cup-shaped opening of the dye vaporizer which is connected to the quartz cuvette 1 and is displaced toward the dye 6, so that the cut-out hole in the cover has a temperature like that of the heated quartz cuvette 1.

This dye vaporizer provides the capability of definitely setting an extremely low dye vapor deposition rate of $<10^{-5}$ nm/s, since such rates are not accessible to direct measurement. Such low rates of deposition are achieved by using the temperature-regulated dye vaporizer with high temperature distribution homogeneity in the quartz cuvette 1, with a small heated cut-out hole in the cover of the quartz cuvette 1, and extrapolation based on calibration with an Arrhenius plot (FIG. 5).

The invention claimed is:

1. Photoluminescent layer for application to a substrate, comprising a matrix material comprising silicon oxide or metal oxide and an organic dye molecule within the matrix material, wherein the concentration of the organic dye molecule is less than 0.65 volume percent with respect to the matrix material and the matrix material has a sub-stoichiometric oxygen content.

2. Photoluminescent layer of claim 1, wherein the matrix material with the substoichiometric oxygen content is $SiO_x$ or $TiO_x$.

3. Photoluminescent layer of claim 2, wherein an average spacing between organic dye molecules within the matrix is at least about 50 nanometers.

4. The layer of claim 3, wherein the organic dye molecules occupy a single plane within the matrix.

5. The layer of claim 2, wherein x is at least 1.95 and is less than 2.

6. Photoluminescent layer of claim 1, wherein an average spacing between organic dye molecules within the matrix is at least about 50 nanometers.

7. The layer of claim 6, wherein the organic dye molecules occupy a single plane within the matrix.

8. An article comprising a substrate and the layer of claim 7 applied to the substrate, wherein the matrix material is a vapor deposited layer on the substrate.

9. The layer of claim 1, wherein the oxygen content of the matrix material is at least 97.5% of a stoichiometric oxygen content of the material, wherein the matrix material is $SiO_x$ or $TiO_x$.

10. The layer of claim 9, wherein an average spacing between organic dye molecules within the matrix is at least about 50 nanometers.

11. An article comprising the layer of claim 9, the article comprising a substrate and wherein the matrix is a layer on the substrate.

12. The article of claim 11, wherein the matrix material is a vapor deposited layer on the substrate.

13. The layer of claim 9, wherein the concentration of the organic dye molecule is at least 0.1 volume percent with respect to the matrix material.

14. An article comprising a substrate and the layer of claim 1 applied to the substrate.

15. The article of claim 14, wherein the matrix material is a vapor deposited layer on the substrate.

16. The article of claim 15, wherein the concentration of the organic dye molecule is at least 0.1 volume percent with respect to the matrix material.

17. The layer of claim 1, wherein the concentration of the organic dye molecule is at least 0.1 volume percent with respect to the matrix material.

18. A photoluminescent composition, comprising:
   a matrix material comprising a metal oxide, wherein the matrix material has a sub-stoichiometric oxygen content; and
   an amount of an organic dye molecule within the matrix material, wherein the organic dye molecule is present within the matrix material at a concentration of less than 0.65 volume percent with respect to the matrix material.

19. An article comprising the composition of claim 18, the article comprising a substrate and wherein the composition is a layer on the substrate.

20. The article of claim 19, wherein the oxygen content of the matrix material is at least 97.5% of a stoichiometric oxygen content of the material, wherein the matrix material is $TiO_x$.

21. The article of claim 20, wherein the organic dye molecule is present within the matrix material at a concentration of at least 0.1 volume percent with respect to the matrix material.

22. The article of claim 20, wherein the layer is a vapor deposited layer.

23. A photoluminescent composition, comprising:
   a vapor-deposited matrix material comprising silicon oxide or a metal oxide; and
   an organic dye molecule within the matrix material, wherein the concentration of the organic dye molecule is less than 0.65 volume percent with respect to the matrix material.

24. The photoluminescent composition of claim 23, wherein the matrix material has a sub-stoichiometric oxygen content.

25. An article comprising the photoluminescent composition of claim 23, the article comprising a substrate and wherein the composition is a layer on the substrate.

* * * * *